United States Patent
Takenaka

(10) Patent No.: US 9,113,569 B2
(45) Date of Patent: Aug. 18, 2015

(54) WIRING BOARD AND METHOD FOR MANUFACTURING SAME

(75) Inventor: Yoshinori Takenaka, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 13/414,861

(22) Filed: Mar. 8, 2012

(65) Prior Publication Data

US 2012/0306608 A1     Dec. 6, 2012

Related U.S. Application Data

(60) Provisional application No. 61/467,716, filed on Mar. 25, 2011.

(51) Int. Cl.
| | |
|---|---|
| *H01F 5/00* | (2006.01) |
| *H01F 27/28* | (2006.01) |
| *H01F 27/30* | (2006.01) |
| *H05K 1/16* | (2006.01) |
| *H05K 1/02* | (2006.01) |
| *H05K 3/46* | (2006.01) |

(52) U.S. Cl.
CPC ............... *H05K 1/165* (2013.01); *H05K 1/0233* (2013.01); *H05K 3/4644* (2013.01); *H05K 2201/09527* (2013.01); *H05K 2201/09672* (2013.01); *Y10T 29/4913* (2015.01)

(58) Field of Classification Search
CPC ............ H01F 27/2804; H01F 17/0013; H01F 17/0033; H01F 5/003; H01F 41/041
USPC .................. 336/200, 220, 225, 230, 198, 186
See application file for complete search history.

(56) References Cited

U.S. PATENT DOCUMENTS

| | | | | |
|---|---|---|---|---|
| 7,694,414 | B2* | 4/2010 | Maeda et al. ................. | 29/832 |
| 2002/0075116 | A1* | 6/2002 | Peels et al. .................... | 336/200 |
| 2002/0162687 | A1* | 11/2002 | Akihiko ........................ | 174/262 |
| 2009/0242261 | A1 | 10/2009 | Takenaka et al. | |
| 2010/0006334 | A1 | 1/2010 | Takenaka | |
| 2012/0119866 | A1* | 5/2012 | Kim et al. ..................... | 336/200 |

FOREIGN PATENT DOCUMENTS

| | | |
|---|---|---|
| JP | 8-237060 | 9/1996 |
| JP | 2001-217514 | 8/2001 |

(Continued)

OTHER PUBLICATIONS

U.S. Appl. No. 13/424,491, filed Mar. 20, 2012, Kawal, et al.
U.S. Appl. No. 13/424,420, filed Mar. 20, 2012, Takenaka.
U.S. Appl. No. 13/414,861, filed Mar. 8, 2012, Takenaka.

*Primary Examiner* — Elvin G Enad
*Assistant Examiner* — Kazi Hossain
(74) *Attorney, Agent, or Firm* — Oblon, McClelland, Maier & Neustadt, L.L.P.

(57) ABSTRACT

A wiring board includes a core structure having a first surface and a second surface on the opposite side of the first surface, a first buildup structure formed on the first surface of the core structure and including insulation layers, and a second buildup structure formed on the second surface of the core structure and including insulation layers and an inductor device. The insulation layers in the second buildup structure have the thicknesses which are thinner than the thicknesses of the insulation layers in the first buildup structure, and the inductor device in the second buildup structure is position on the second surface of the core structure and includes at least a portion of a conductive pattern formed in the core structure.

20 Claims, 17 Drawing Sheets

(56) References Cited

FOREIGN PATENT DOCUMENTS

| JP | 2001217514 A | * | 8/2001 |
| JP | 2005-347286 | | 12/2005 |
| JP | 2008-270532 | | 11/2008 |
| JP | 2008270532 A | * | 11/2008 |
| JP | 2009-016504 | | 1/2009 |
| JP | 2009-60151 | | 3/2009 |

* cited by examiner

WIRING BOARD AND METHOD FOR MANUFACTURING SAME

CROSS-REFERENCE TO RELATED APPLICATIONS

The present application is based on and claims the benefit of priority to U.S. Application No. 61/467,716, filed Mar. 25, 2011, the entire contents of which are incorporated herein by reference.

BACKGROUND OF THE INVENTION

1. Field of the Invention

The present invention relates to a wiring board and its manufacturing method.

2. Discussion of the Background

Japanese Patent Application No. 2009-16504 describes a wiring board with a built-in spiral inductor. The contents of Japanese Laid-Open Patent Publication No. 2009-16504 are incorporated herein by reference in their entirety in this application.

SUMMARY OF THE INVENTION

According to one aspect of the present invention, a wiring board includes a core structure having a first surface and a second surface on the opposite side of the first surface, a first buildup structure formed on the first surface of the core structure and including insulation layers, and a second buildup structure formed on the second surface of the core structure and including insulation layers and an inductor device. The insulation layers in the second buildup structure have the thicknesses which are thinner than the thicknesses of the insulation layers in the first buildup structure, and the inductor device in the second buildup structure is position on the second surface of the core structure and includes at least a portion of a conductive pattern formed in the core structure.

According to another aspect of the present invention, a method for manufacturing a wiring board includes preparing a core structure, forming on a first surface of the core structure a first buildup structure including insulation layers, and forming on a second surface of the core structure on the opposite side of the first surface of the core structure a second buildup structure including insulation layers and a inductor device. The insulation layers in the second buildup structure have the thicknesses which are thinner than the thicknesses of the insulation layers in the first buildup structure, and the forming of the second buildup structure includes forming the inductor device in the second buildup structure on the second surface of the core structure such that at least a portion of a conductive pattern formed in the core structure is included as a portion of the inductor device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
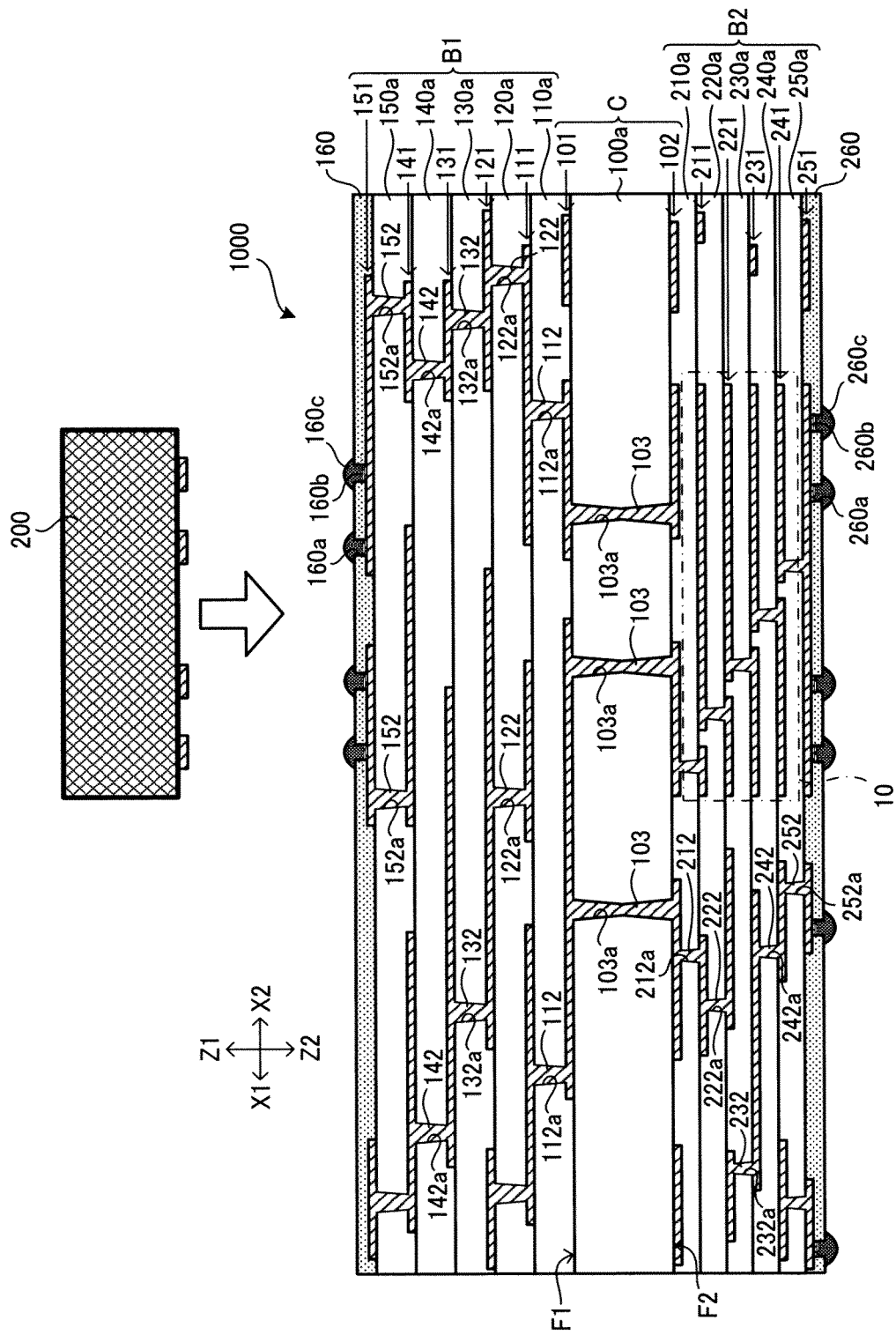
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board (or a direction of the thickness of the wiring board), corresponding to a direction along a normal line to the main surfaces (upper and lower surfaces) of the wiring board. On the other hand, arrows (X1, X2) and (Y1, Y2) each indicate a direction perpendicular to a lamination direction (or toward a side of each layer). The main surfaces of a wiring board are on the X-Y plane. Side surfaces of a wiring board are on the X-Z plane or the Y-Z plane. "Directly on" or "directly under" means along a direction Z (the Z1 side or the Z2 side).

Two main surfaces facing opposite directions of a normal line are referred to as a first surface (the Z1-side surface) and a second surface (the Z2-side surface). In lamination directions, the side closer to the core is referred to as a lower layer (or inner-layer side), and the side farther from the core is referred to as an upper layer (or outer-layer side). In a buildup section, a tier, a unit of which is a pair of an insulation layer and a conductive layer formed on the insulation layer, is formed by alternately laminating a conductive layer and an insulation layer (interlayer insulation layer). On both sides of a core substrate, an insulation layer and a conductive layer on the core substrate is referred to as a first tier, and further upper layers are consecutively referred to as a second tier, a third tier, and so forth.

Conductive layers indicate layers including one or more conductive patterns. A conductive layer may include a conductive pattern that forms an electrical circuit, wiring (including ground), a pad, a land or the like; or a conductive layer may include a plain conductive pattern that does not form an electrical circuit.

Opening portions include notches and cuts other than holes and grooves. Holes are not limited to penetrating holes, and may also be non-penetrating holes. Holes include via holes and through holes. Hereinafter, the conductor formed in a via hole (wall surface or bottom surface) is referred to as a via conductor, and the conductor formed in a through hole (wall surface) is referred to as a through-hole conductor.

Among the conductors formed in opening portions (such as via conductors and through-hole conductors), the conductive film formed on the inner surface (wall surface or bottom surface) of an opening portion is referred to as a conformal conductor, and the conductor filled in an opening portion is referred to as a filled conductor.

Plating includes wet plating such as electrolytic plating as well as dry plating such as PVD (physical vapor deposition) and CVD (chemical vapor deposition).

Unless otherwise specified, the "width" of a hole or a column (protrusion) indicates the diameter if it is a circle, and $2\sqrt{\text{cross section}/\pi}$ if it is other than a circle. Also, when measurements are not uniform (for example, when the surface is roughened or the shape is tapered), basically, the average value of measurements (average of effective values excluding abnormal values) is used. However, if values such as a maximum value other than an average value are indicated to be used, the above definition does not apply.

A ring indicates a planar shape formed by connecting both ends of a line, and includes not only a circle but also a polygon.

Wiring board 1000 of the present embodiment has core section (C), first buildup section (B1) and second buildup section (B2) as shown in FIG. 1. Electronic component 200, for example, is mounted on a surface of wiring board 1000. Electronic component 200 is formed with a semiconductor element, for example. However, electronic component 200 is not limited to such, and any other type may be mounted.

Core section (C) includes substrate (100a). Substrate (100a) is insulative, and corresponds to the core substrate of wiring board 1000. Substrate (100a) is made of epoxy resin, for example, more specifically, made by impregnating glass cloth (core material) with epoxy resin, for example. As for the core material, it is preferred to use inorganic material such as glass fiber or aramid fiber. However, the material for substrate (100a) (core substrate) is not limited to the above, and any other material may be used. For example, it may be resin other than epoxy resin, and it is an option not to include core material. Hereinafter, one of the upper and lower surfaces (two main surfaces) of substrate (100a) is referred to as first surface (F1) and the other as second surface (F2).

Core section (C) has conductive layer 101 on first surface (F1) of substrate (100a) and conductive layer 102 on second surface (F2) of substrate (100a). Conductive layers (101, 102) each include a land of through-hole conductor 103.

Through hole (103a) which penetrates through substrate (100a) is formed in substrate (100a) (core substrate). By filling conductor (such as conductor made of copper plating) in through hole (103a), through-hole conductor 103 is formed. A conductive pattern of conductive layer 101 and a conductive pattern of conductive layer 102 are electrically connected to each other by the conductor (through-hole conductor 103) in through hole (103a).

Figure 2:
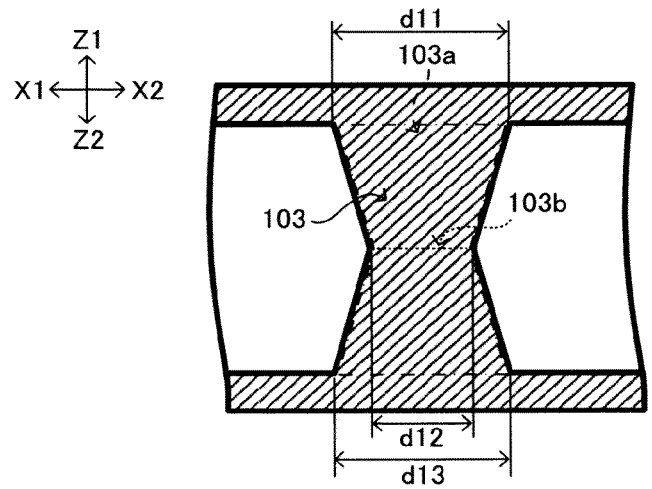
FIG. 2 is a cross-sectional view of a through-hole conductor according to the embodiment of the present invention.

As shown in FIG. 2, for example, through-hole conductor 103 is shaped as an hourglass. Namely, through-hole conductor 103 has narrowed portion (103b), and the width of through-hole conductor 103 gradually decreases as it comes closer to narrowed portion (103b) from first surface (F1), and also gradually decreases as it comes closer to narrowed portion (103b) from second surface (F2). However, the shape of through-hole conductor 103 is not limited to such, and it may also be substantially a column, for example.

The width of the conductor in through hole (103a) (through-hole conductor 103) is preferred to be approximately 150 μm or less. Here, the width of through-hole conductor 103 means the maximum value (maximum width) of the width of through-hole conductor 103, corresponding to widths (d11, d13) at opening ends of the through hole in the present embodiment. In the present embodiment, width (d11) at one end of through-hole conductor 103 is 100 μm, for example, width (d13) at the other end of through-hole conductor 103 is 100 μm, for example, and width (d12) at narrowed portion (103b) of through-hole conductor 103 is 70 μm, for example.

First buildup section (B1) is formed on first surface (F1) of substrate (100a), and second buildup section (B2) is formed on second surface (F2) of substrate (100a). First buildup section (B1) is formed by alternately laminating conductive layers (111, 121, 131, 141, 151) and insulation layers (110a, 120a, 130a, 140a, 150a); and second buildup section (B2) is formed by alternately laminating conductive layers (211, 221, 231, 241, 251) and insulation layers (210a, 220a, 230a, 240a, 250a). In the present embodiment, the number of tiers in first buildup section (B1) and the number of tiers in second buildup section (B2) are the same (five). More specifically, insulation layers (110a, 210a) and conductive layers (111, 211) form first tiers; insulation layers (120a, 220a) and conductive layers (121, 221) form second tiers; insulation layers (130a, 230a) and conductive layers (131, 231) form third tiers; insulation layers (140a, 240a) and conductive layers (141, 241) form fourth tiers; and insulation layers (150a, 250a) and conductive layers (151, 251) form fifth tiers.

Insulation layers (110a~150a) and (210a~250a) each correspond to an interlayer insulation layer. In the present embodiment, insulation layers (110a~150a) and insulation layers (210a~250a) each contain epoxy resin and inorganic filler. However, the material for each insulation layer is not limited to such and may contain any other material. For example, resin other than epoxy resin may be used, and a core material may also be included.

First buildup section (B1) includes via conductors (112, 122, 132, 142, 152) (each a filled conductor) for interlayer connections, and second buildup section (B2) includes via conductors (212, 222, 232, 242, 252) (each a filled conductor) for interlayer connections. In particular, via holes (112a, 122a, 132a, 142a, 152a) are formed respectively in insulation layers (110a, 120a, 130a, 140a, 150a), and copper plating, for example, is filled in those via holes (112a) and the like to form via conductors (112, 122, 132, 142, 152). Also, via holes (212a, 222a, 232a, 242a, 252a) are formed respectively in insulation layers (210a, 220a, 230a, 240a, 250a), and copper plating, for example, is filled in those via holes (212a) and the like to form via conductors (212, 222, 232, 242, 252).

In each buildup section, conductive layers on different tiers (specifically, each conductive pattern on two vertically adjacent conductive layers) are electrically connected to each other by a conductor in a via hole (via conductor) formed in the interlayer insulation layer. More specifically, in first buildup section (B1), conductive layers (111, 121, 131, 141, 151) are electrically connected to each other by via conductors (122, 132, 142, 152) positioned in their respective interlayers. Also, in second buildup section (B2), conductive layers (211, 221, 231, 241, 251) are electrically connected to each other by via conductors (222, 232, 242, 252) positioned in their respective interlayers. In addition, conductive layer 111 is electrically connected to conductive layer 101 on substrate (100a) by via conductor 112, and conductive layer 211 is electrically connected to conductive layer 102 on substrate (100a) by via conductor 212.

Figure 3:
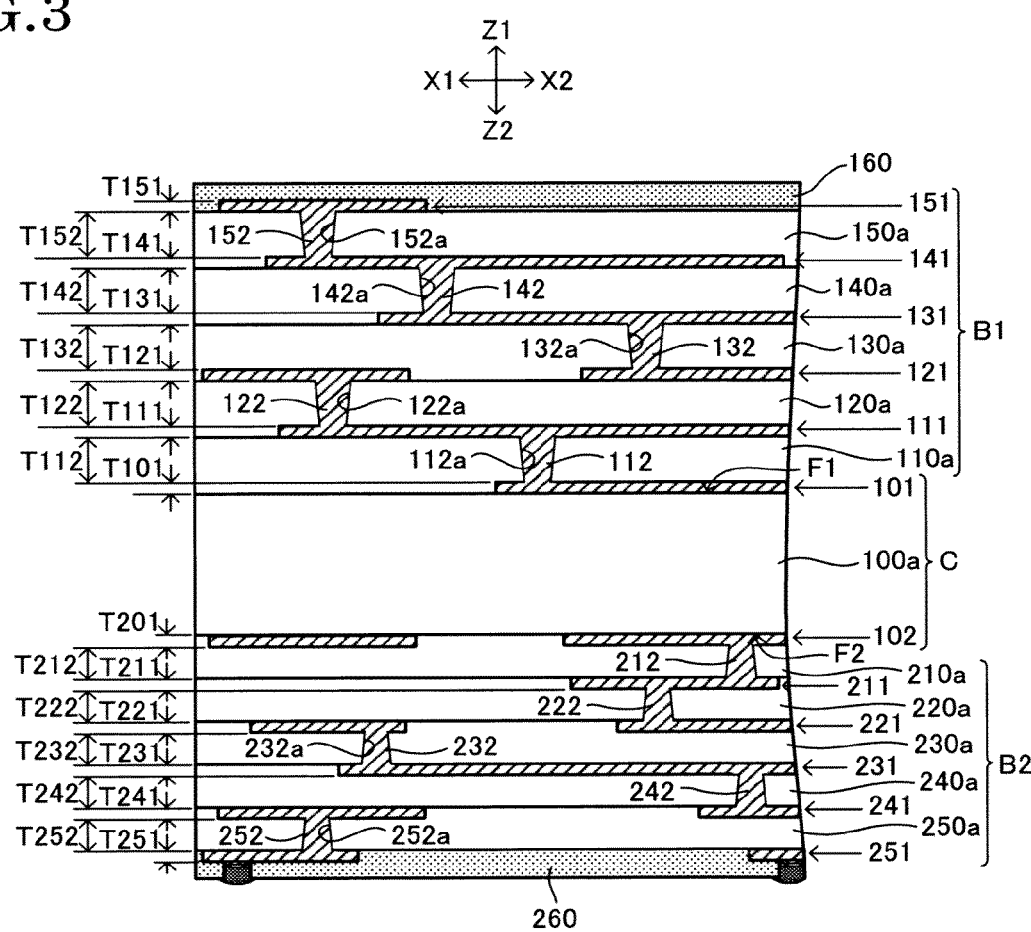
FIG. 3 is a cross-sectional view showing measurements of each conductive layer, each insulation layer and each via conductor in a wiring board according to the embodiment of the present invention.

FIG. 3 shows measurements of each conductive layer, each insulation layer and each via conductor.

In the present embodiment, insulation layers (210a~250a) are each thinner than any of insulation layers (110a~150a). Specifically, thickness (T112) of insulation layer (110a), thickness (T122) of insulation layer (120a), thickness (T132) of insulation layer (130a), thickness (T142) of insulation layer (140a) and thickness (T152) of insulation layer (150a) each have the same thickness (hereinafter referred to as (T1)), for example, in the range of 20~30 μm. Also, thickness (T212) of insulation layer (210a), thickness (T222) of insulation layer (220a), thickness (T232) of insulation layer (230a), thickness (T242) of insulation layer (240a) and thickness (T252) of insulation layer (250a) each have the same thickness (hereinafter referred to as (T2)), for example, in the range of 10~20 μm. T2/T1 is in the range of approximately 1~approximately 3. When T2/T1 is in the range of approximately 1~approximately 3, the ratio of conductive layers (conductive patterns) in each buildup section is in a required range, and the warping of the wiring board is effectively suppressed. Moreover, insulation between conductive patterns adjacent in a direction Z is secured. Here, the above thicknesses mean the distance between conductive patterns adjacent in a direction Z.

When the tiers in the same ordinal number are compared, the insulation layer in second buildup section (B2) is thinner than the insulation layer in first buildup section (B1) in all the tiers. Specifically, the following are satisfied: thickness (T112)>thickness (T212), thickness (T122)>thickness (T222), thickness (T132)>thickness (T232), thickness (T142)>thickness (T242) and thickness (T152)>thickness (T252).

Each of conductive layers (111~151) and each of conductive layers (211~251) all have the same thickness. Specifically, each of the following has the same thickness, for example, in the range of 5~20 μm: thickness (T111) of conductive layer 111, thickness (T121) of conductive layer 121, thickness (T131) of conductive layer 131, thickness (T141) of conductive layer 141, thickness (T151) of conductive layer 151, thickness (T211) of conductive layer 211, thickness (T221) of conductive layer 221, thickness (T231) of conductive layer 231, thickness (T241) of conductive layer 241 and thickness (T251) of conductive layer 251.

Thickness (T101) of conductive layer 101 is thicker than conductive layers 111 and the like in first buildup section (B1), and is in the range of 20~30 μm, for example. Thickness (T201) of conductive layer 102 is thicker than conductive layers 211 and the like in second buildup section (B2), and is in the range of 20~30 μm, for example.

Conductors (via conductors 212~252) in via holes formed in interlayer insulation layers of second buildup section (B2) each have a shallower depth than any of the conductors (via conductors 112~152) in via holes formed in interlayer insulation layers of first buildup section (B1).

Inductor unit 10 (inductor section) is built into wiring board 1000 of the present embodiment. In the following, the structure of inductor unit 10 is described with reference to FIGS. 4~7. In each drawing, conductive patterns (21a, 21b) are included in conductive layer 102, conductive patterns (11a, 11b) are included in conductive layer 211, conductive patterns (12a, 12b) are included in conductive layer 221, conductive patterns (13a, 13b) are included in conductive layer 231, conductive patterns (14a, 14b) are included in conductive layer 241, and conductive pattern 22 is included in conductive layer 251. Connection conductors (30a, 30b) correspond to through-hole conductors 103, connection conductors (31a, 31b) correspond to via conductors 212, connection conductors (32a, 32b) correspond to via conductors 222, connection conductors (33a, 33b) correspond to via conductors 232, connection conductors (34a, 34b) correspond to via conductors 242, and connection conductors (35a, 35b) correspond to via conductors 252.

Figure 4:
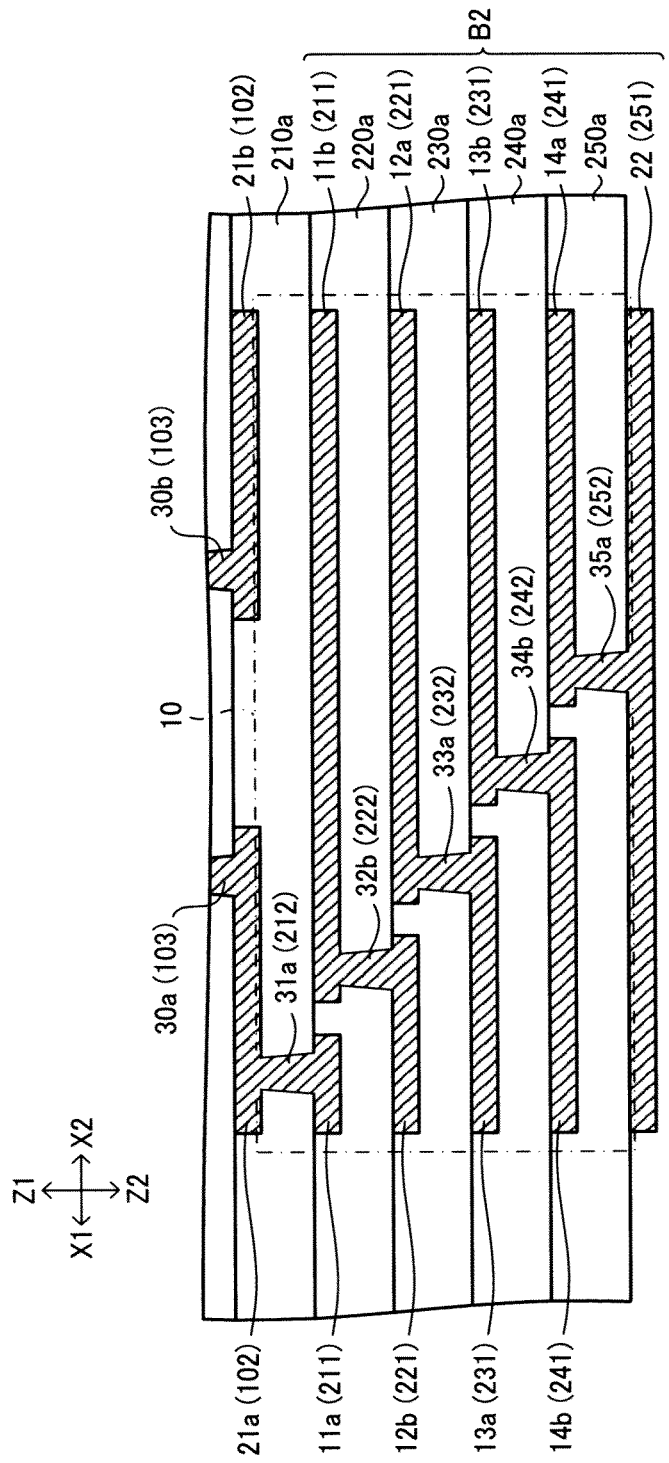
FIG. 4 is a cross-sectional view of an inductor unit according to the embodiment of the present invention.
Figure 5:
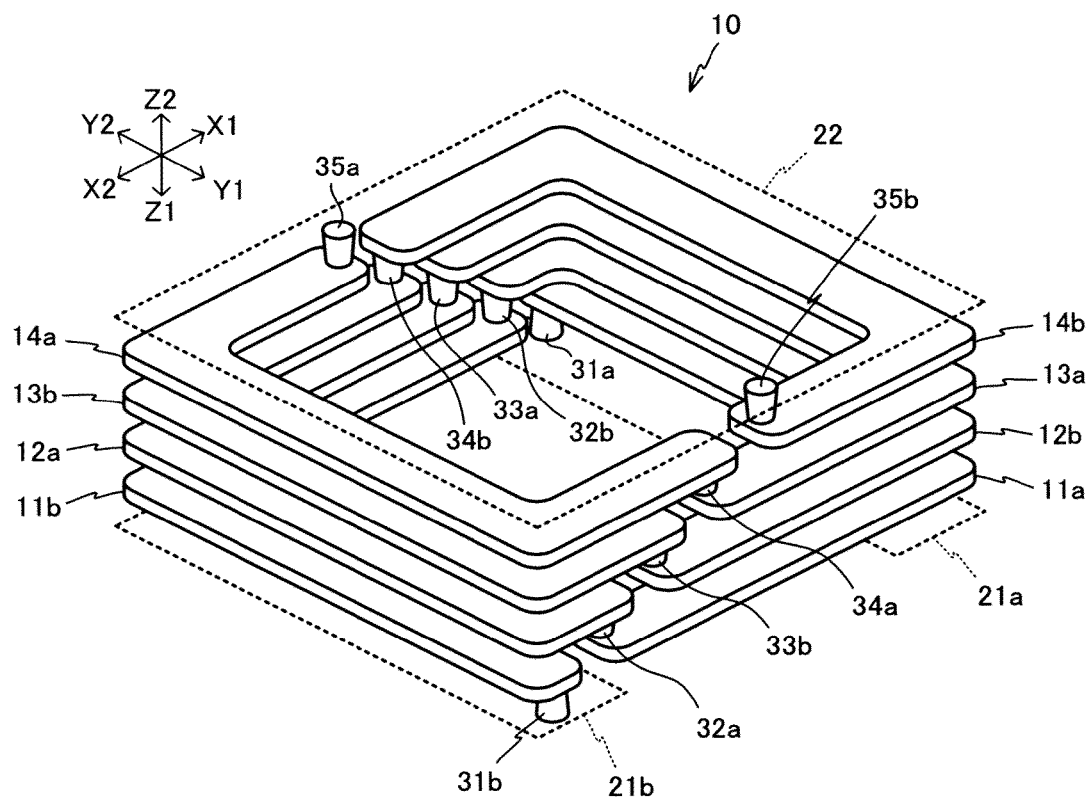
FIG. 5 is a perspective view of the inductor unit according to the embodiment of the present invention.
Figure 6:
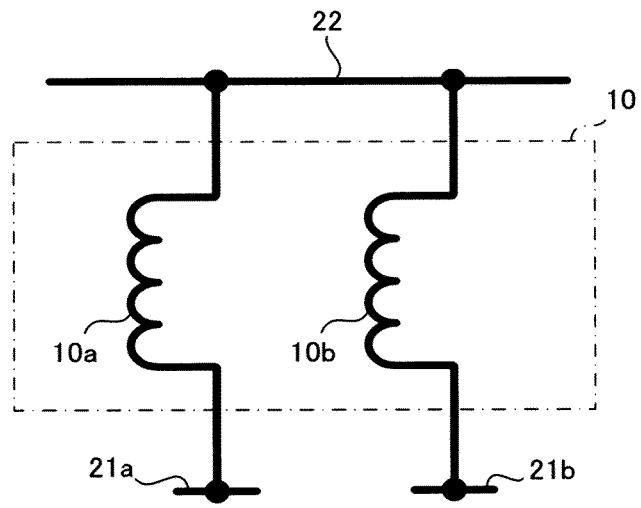
FIG. 6 is a circuit diagram of the inductor unit according to the embodiment of the present invention.

As shown in FIGS. 4-7B, in inductor unit 10 of the present embodiment, four layers of conductive patterns (11a~14a) and (11b~14b) make multiple (such as two) one-turn inductors. Specifically, inductor unit 10 includes first inductor (10a) and second inductor (10b). As shown in FIG. 6, first inductor (10a) and second inductor (10b) are connected parallel to each other.

Figure 7A:
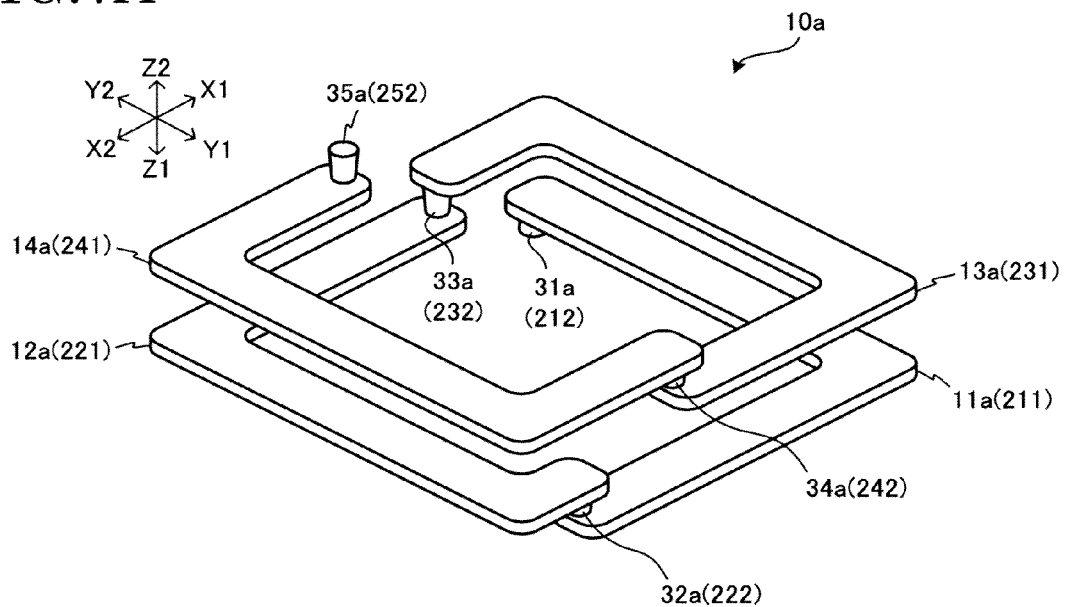
FIG. 7A is a perspective view of a first inductor of the inductor unit according to the embodiment of the present invention.

As shown in FIGS. 4 and 7A, first inductor (10a) is formed with the conductors in second buildup section (B2), in particular, connection conductors (31a~35a) (via conductors 212~252), and with conductive patterns (11a~14a) of conductive layers (211~241) (second conductive layers) electrically connected to each other by connection conductors (32a~34a). Also, as shown in FIGS. 4 and 7B, second inductor (10b) is formed with the conductors in second buildup section (B2), in particular, connection conductors (31b~35b) (via conductors 212~252), and with conductive patterns (11b~14b) of conductive layers (211~241) electrically connected to each other by connection conductors (32b~34b).

Insulation layers (220a~240a) between conductive patterns of inductor unit 10 (first inductor (10a) and second inductor (10b)) are each thinner than any of insulation layers (110a~150a) as described above (see FIG. 3). Also, conductors in via holes (via conductors 222~241) electrically connecting the conductive patterns of conductive layers (211~242) of inductor unit 10 (first inductor (10a) and second inductor (10b)) are each thinner than any of the conductors (via conductors 112~152) in via holes formed in insulation layers (110a~150a) (see FIG. 3).

Figure 7B:
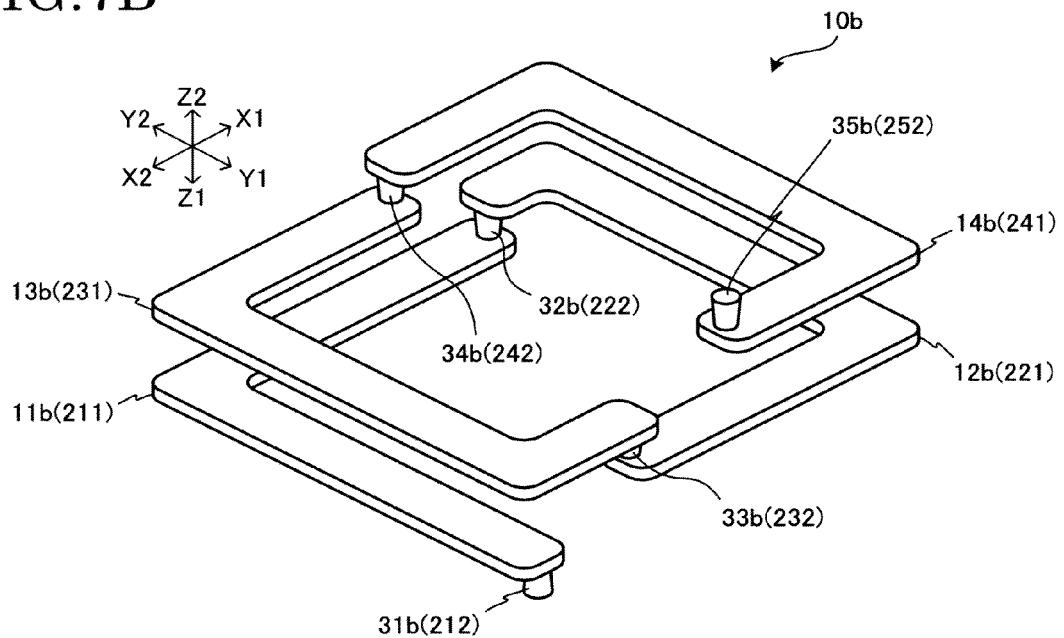
FIG. 7B is a perspective view of a second inductor of the inductor unit according to the embodiment of the present invention.

In the present embodiment, first inductor (10a) and second inductor (10b) are each shaped in a spiral form and are substantially annular (more specifically, substantially rectangular) in a plan view as shown in FIGS. 7A and 7B.

Conductive patterns (11a~14a) and (11b~14b) of inductor unit 10 (first inductor (10a) and second inductor (10b)) are each made of a substantially U-shaped or substantially L-shaped conductor. A pair of conductive patterns positioned on different tiers and electrically connected to each other by the conductor in a via hole (connection conductors (32a~34a) and (32b~34b)) are each formed to be substantially U-shaped or substantially L-shaped and substantially facing each other. Specifically, in first inductor (10a), a pair of conductive patterns (11a) and (12a), a pair of conductive patterns (12a) and (13a) and a pair of conductive patterns (13a) and (14a) are each formed to be substantially U-shaped or substantially L-shaped and substantially facing each other as shown in FIG. 7A. Also, in second inductor (10b), a pair of conductive patterns (11b) and (12b), a pair of conductive patterns (12b) and (13b) and a pair of conductive patterns (13b) and (14b) are each formed to be substantially U-shaped or substantially L-shaped and substantially facing each other as shown in FIG. 7B.

In first inductor (10a), as shown in FIG. 7A, an end of substantially L-shaped conductive pattern (11a) is connected to an end of substantially L-shaped conductive pattern (12a) by connection conductor (32a), the other end of conductive pattern (12a) is connected to an end of substantially U-shaped conductive pattern (13a) by connection conductor (33a), and the other end of conductive pattern (13a) is connected to an end of substantially U-shaped conductive pattern (14a) by connection conductor (34a). Also, connection conductor (31a) is formed at the other end of conductive pattern (11a) (the end not connected to conductive pattern (12a)), and connection conductor (35a) is formed on the other end of conductive pattern (14a) (the end not connected to conductive pattern (13a)). In doing so, by conductive patterns (11a~14a) connected to each other in series, two-turn first inductor (10a) is formed in the present embodiment.

In second inductor (10b), as shown in FIG. 7B, an end of substantially L-shaped conductive pattern (11b) is connected to an end of substantially L-shaped conductive pattern (12b) by connection conductor (32b), the other end of conductive pattern (12b) is connected to an end of substantially U-shaped conductive pattern (13b) by connection conductor (33b), and the other end of conductive pattern (13b) is connected to an end of substantially U-shaped conductive pattern (14b) by connection conductor (34b). Also, connection conductor (31b) is formed at the other end of conductive pattern (11b) (the end not connected to conductive pattern (12b)), and connection conductor (35b) is formed on the other end of conductive pattern (14b) (the end not connected to conductive pattern (13b)). In doing so, by conductive patterns (11b~14b) connected to each other in series, two-turn second inductor (10b) is formed in the present embodiment.

As shown in FIGS. 4-6, conductive pattern (11a) of first inductor (10a) is connected to conductive pattern (21a) of conductive layer 102 by connection conductor (31a), and conductive pattern (11b) of second inductor (10b) is connected to conductive pattern (21b) of conductive layer 102 by connection conductor (31b). Conductive pattern (14a) of first inductor (10a) and conductive pattern (14b) of second inductor (10b) are connected to conductive pattern 22 by connection conductor (35a) and connection conductor (35b) respectively. First inductor (10a) and second inductor (10b) are electrically connected to each other by conductive pattern 22 (see FIG. 6).

Figure 8A:
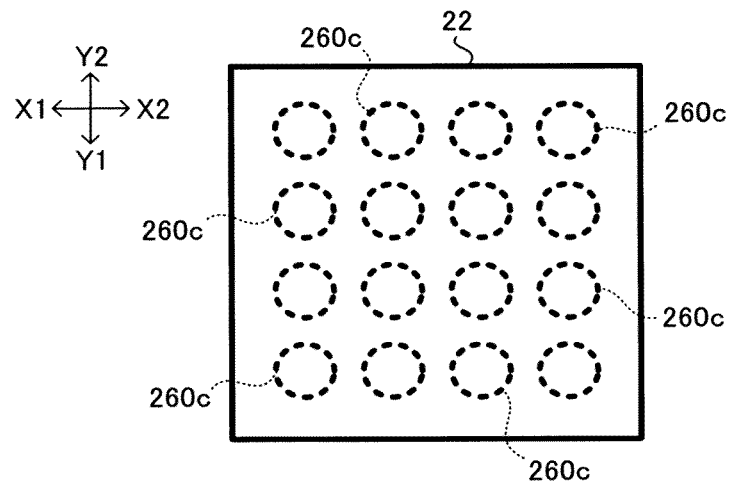
FIG. 8A is a view showing the positioning of external connection terminals formed on one end of the inductor unit according to the embodiment of the present invention.
Figure 8B:
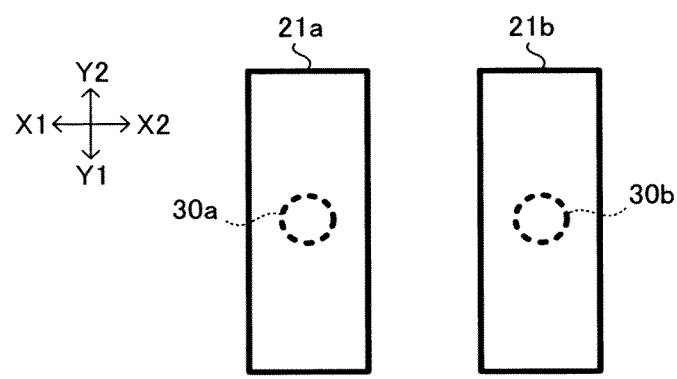
FIG. 8B is a view showing the positioning of connection conductors (through-hole conductors) to be connected to the other end of the inductor unit according to the embodiment of the present invention.

As shown in FIG. 8A, for example, a required number of solder bumps (260c) (external connection terminals) are formed on conductive pattern 22 (substantially the entire surface, for example). Also, as shown in FIG. 8B, for example, connection conductor (30a) (through-hole conductor 103) is connected to conductive pattern (21a) of conductive layer 102, and connection conductor (30b) (through-hole conductor 103) is connected to conductive pattern (21b) of conductive layer 102. Through-hole conductors 103 with a small diameter are connected to first inductor (10a) and second inductor (10b), and the L value of inductor unit 10 (inductor section) tends to be improved.

Figure 9:
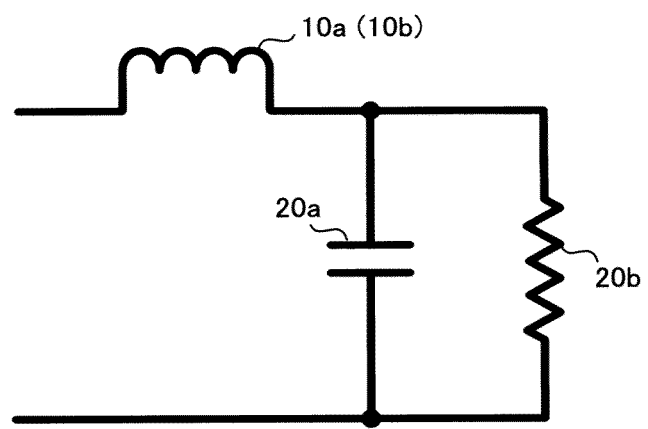
FIG. 9 is a view showing an example of the circuit of an inductor built into a wiring board according to the embodiment of the present invention.

First inductor (10a) or second inductor (10b) forms a smoothing circuit by being connected to capacitor (20a) and resistance element (20b) as shown in FIG. 9, for example. Capacitor (20a) and resistance element (20b) are formed in first buildup section (B1) or second buildup section (B2), for example. Accordingly, voltage is smoothed near electronic component 200 (FIG. 1), and loss of power supply for electronic component 200 tends to be reduced. Capacitor (20a) and resistance element (20b) may be mounted on a surface of wiring board 1000 as electronic component 200 (see FIG. 1).

As shown in FIG. 1, conductive layer 151 is the outermost conductive layer on the first-surface (F1) side, and conductive layer 251 is the outermost conductive layer on the second-surface (F2) side in wiring board 1000 of the present embodiment. Solder resists (160, 260) are formed respectively on conductive layers (151, 251). However, opening portions (160a, 260a) are formed respectively in solder resists (160, 260). Anticorrosion layer (160b) is formed on conductive layer 151 exposed through opening portion (160a), and anticorrosion layer (260b) is formed on conductive layer 251 exposed through opening portion (260a).

In the present embodiment, anticorrosion layers (160b, 260b) are each made of Ni/Pd/Au film, for example. Anticorrosion layers (160b, 260b) are formed by electroless plating, for example. Also, by conducting an OSP treatment, anticorrosion layers (160b, 260b) may be formed with organic protective film. Anticorrosion layers (160b, 260b) are not always required, and they may be omitted unless necessary.

Solder bump (160c) is formed on anticorrosion layer (160b), and solder bump (260c) is formed on anticorrosion layer (260b). Solder bump (160c) becomes an external connection terminal for mounting electronic component 200 (FIG. 1), for example, and solder bump (260c) becomes an external connection terminal for electrical connection with another wiring board (such as a motherboard), for example. However, the usage of solder bumps (160c, 260c) is not limited to such, and they may be used for any other purposes.

Figure 10A:
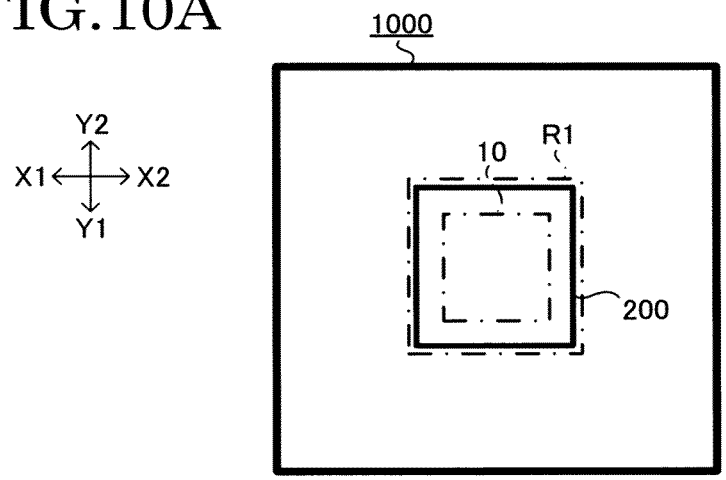
FIG. 10A is a view showing a first relationship between an inductor unit and the mounting region for an electronic component (projected region) in a wiring board according to the embodiment of the present invention.
Figure 10B:
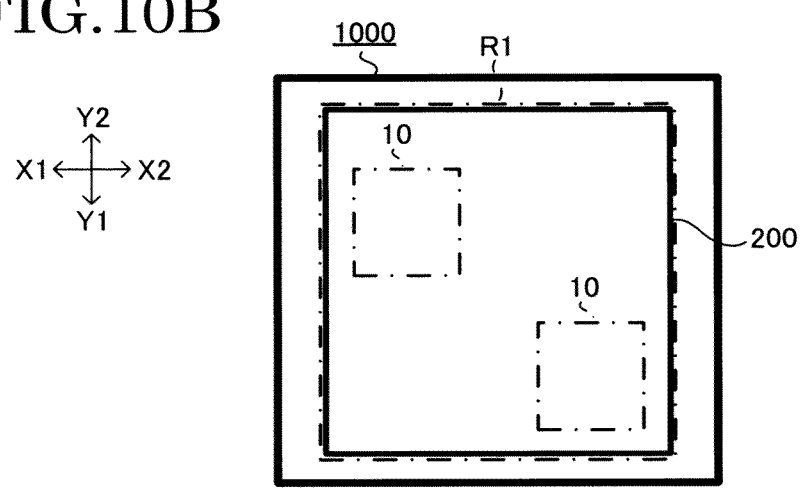
FIG. 10B is a view showing a second relationship between inductor units and the mounting region for an electronic component (projected region) in a wiring board according to the embodiment of the present invention.
Figure 10C:
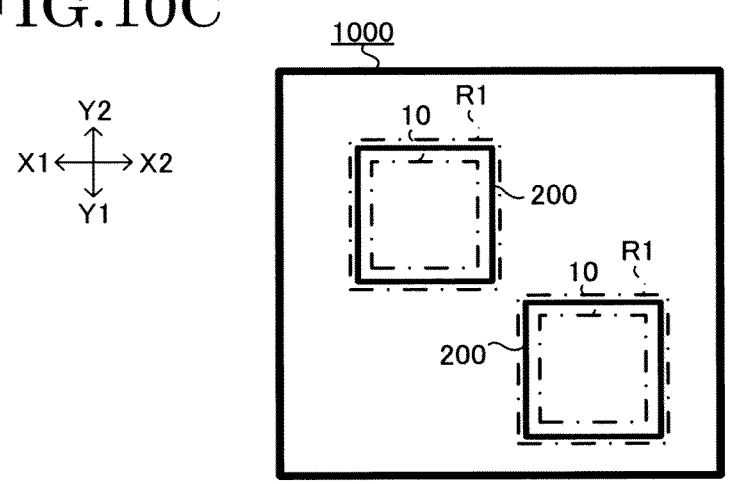
FIG. 10C is a view showing a third relationship between inductor units and the mounting regions for electronic components (projected regions) in a wiring board according to the embodiment of the present invention.

As shown in FIGS. 1 and 10A, wiring board 1000 of the present embodiment has a region for mounting electronic component 200 (mounting region R1) on one surface (the first-surface (F1) side, for example). Inductor unit 10 (first inductor (10a) and second inductor (10b)) is positioned directly under mounting region (R1) (the projected region of electronic component 200). FIG. 10A shows an example in which one inductor unit 10 is positioned directly under one mounting region (R1). However, the present embodiment is not limited to such. For example, as shown in FIG. 10B, two inductor units 10 may be positioned directly under one mounting region (R1). Alternatively, as shown in FIG. 10C, multiple (such as two) mounting regions (R1) are formed at least on one surface of wiring board 1000, and inductor unit 10 is positioned directly under each mounting region (R1).

Figure 11A:
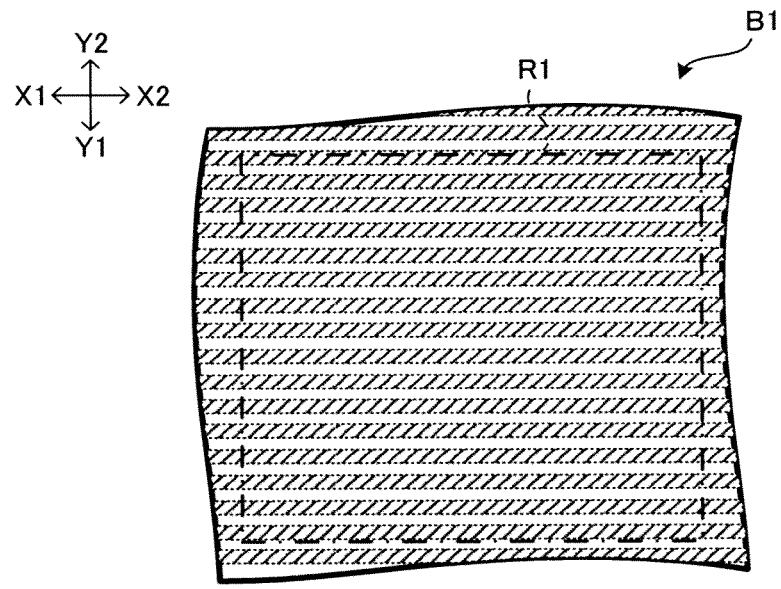
FIG. 11A is, directly under a mounting region of a wiring board according to the embodiment of the present invention, a view showing an example of a conductive pattern of a conductive layer in a first buildup section.
Figure 11B:
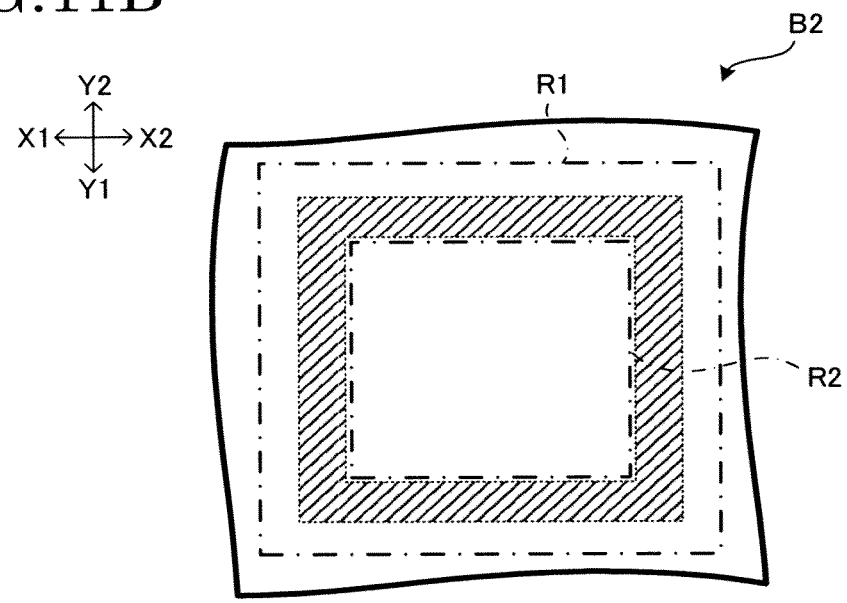
FIG. 11B is, directly under a mounting region of a wiring board according to the embodiment of the present invention, a view showing an example of a conductive pattern of a conductive layer in a second buildup layer.

FIG. 11A shows an example of the conductive pattern of a conductive layer in first buildup section (B1) directly under mounting region (R1) (the projected region of electronic component 200), and FIG. 11B shows an example of the conductive pattern of a conductive layer in second buildup section (B2) directly under mounting region (R1) (the projected region of electronic component 200).

Directly under mounting region (R1), conductive patterns of conductive layers (111~151) (first conductive layers) in first buildup section (B1) form mainly wiring, having L (line)/S (space) of 9 μm/12 μm, for example, as shown in FIG. 11A.

Directly under mounting region (R1), conductive patterns of conductive layers (211~241) (second conductive layers) in second buildup section (B2) form mainly inductor unit 10 (first inductor (10a) and second inductor (10b)) as shown in FIG. 11B. In region (R2) positioned inside spiral first inductor (10a) and second inductor (10b), conductive patterns are not arranged, and resin is filled (insulation layers (220a~240a)). Accordingly, directly under mounting region (R1), the abundance ratio per unit area on the X-Y plane is greater in insulation layers (210a~250a) than in insulation layers (110a~150a).

In the present embodiment, since insulation layers (210a~250a) are each thinner than any of insulation layers (110a~150a) (see FIG. 1), the abundance ratio per unit thickness in a direction Z is greater in insulation layers (110a~150a) than in insulation layers (210a~250a). Accordingly, directly under mounting region (R1) (projected region of electronic component 200), when the ratio (volume ratio) of conductive layers (111~151) (first conductive layers) in first buildup section (B1) is set as (W1), and the ratio (volume ratio) of conductive layers (211~251) (second conductive layers) in second buildup section (B2) is set as (W2), W2/W1 is in the range of approximately 0.9 to approximately 1.2. As a result, the degree of thermal contraction becomes substantially the same in first buildup section (B1) and in second buildup section (B2), and wiring board 1000 seldom warps. Then, it is easier to mount electronic component 200 on wiring board 1000.

To bring the ratio W2/W1 closer to 1, it is an option that the abundance ratio of the conductive layers in first buildup section (B1) on the X-Y plane is made substantially the same as the abundance ratio of the conductive layers in second buildup section (B2) (see FIG. 11B). However, such a method may result in new problems such as lowered design flexibility and difficulty in securing wiring space. For that matter, according to the above structure of the present embodiment, design flexibility is maintained highly and wiring space is secured easily.

Wiring board 1000 of the present embodiment may be electrically connected to an electronic component or another wiring board, for example. As shown in FIG. 1, for example, electronic component 200 (such as an IC chip) is mounted on pads on one side of wiring board 1000 through soldering or the like. Also, using pads on the other side, wiring board 1000 is mounted on another wiring board (such as a motherboard) which is not shown in the drawings. Wiring board 1000 of the present embodiment is used as a circuit board for cell phones, compact computers and the like.

Wiring board 1000 of the present embodiment is manufactured by the following method, for example.

Figure 12:
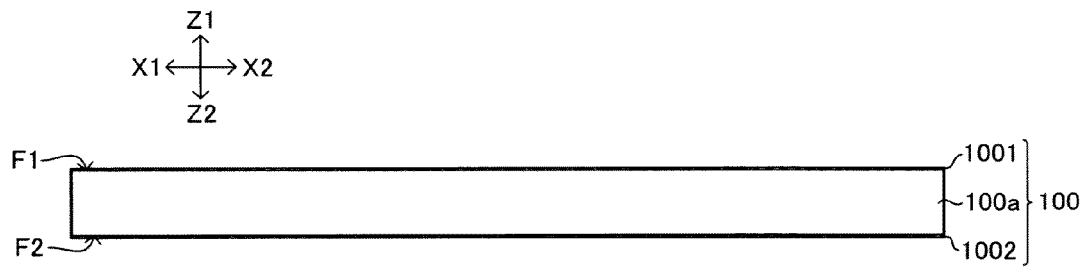
FIG. 12 is a view to illustrate a first step for forming a core section of a wiring board in a method for manufacturing a wiring board according to the embodiment of the present invention.

First, as shown in FIG. 12, double-sided copper-clad laminate 100 is prepared. Double-sided copper-clad laminate 100 is formed with substrate (100a) (core substrate) having first surface (F1) and an opposite second surface (F2), copper foil 1001 formed on first surface (F1) of substrate (100a), and copper foil 1002 formed on second surface (F2) of substrate (100a). Substrate (100a) is made by impregnating glass cloth (core material) with epoxy resin, for example.

Figure 13:
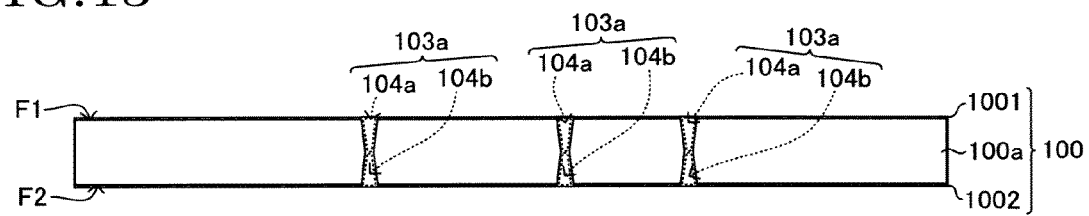
FIG. 13 is a view to illustrate a second step subsequent to the step in FIG. 12.

Next, as shown in FIG. 13, using a $CO_2$ laser, for example, hole (104a) is formed by irradiating the laser at double-sided copper-clad laminate 100 from the first surface (F1) side, and hole (104b) is formed by irradiating the laser at double-sided copper-clad laminate 100 from the second surface (F2) side. Hole (104a) and hole (104b) are connected later to be hourglass-shaped through hole (103a) which penetrates through double-sided copper-clad laminate 100 (see FIG. 2). The boundary of hole (104a) and hole (104b) corresponds to narrowed portion (103b) (FIG. 2). Laser irradiation at first surface (F1) and laser irradiation at second surface (F2) may be conducted simultaneously or separately one surface at a time. After through hole (103a) is formed, desmearing is preferred to be conducted at through hole (103a). Unnecessary conduction (short circuiting) is suppressed by desmearing. Also, prior to laser irradiation, a black-oxide treatment may be conducted on the surfaces of copper foils (1001, 1002) to enhance the efficiency of laser absorption. Instead of laser irradiation, drilling, etching or the like may be employed to form through hole (103a). However, it is easier to perform fine processing by using a laser.

Figure 14:
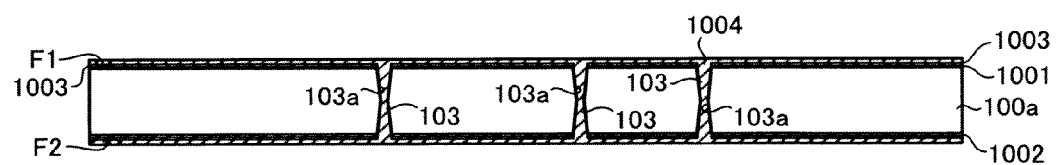
FIG. 14 is a view to illustrate a third step subsequent to the step in FIG. 13.

Next, using a panel plating method, for example, electroless copper-plated film 1003, for example, and electrolytic copper plating 1004, for example, are formed on copper foils (1001, 1002) and in through hole (103a) as shown in FIG. 14. Specifically, electroless plating is first performed to form electroless plated film 1003. Then, using electroless plated film 1003 as a seed layer, electrolytic plating is performed using a plating solution to form electrolytic plating 1004. Accordingly, through hole (103a) is filled with electroless plated film 1003 and electrolytic plating 1004, and through-hole conductor 103 is formed. To enhance adhesion of electroless plated film 1003, a catalyst whose main ingredient is palladium (Pd), for example, may be attached to the wall surface or the like of through hole (103a) prior to electroless plating.

Figure 15:
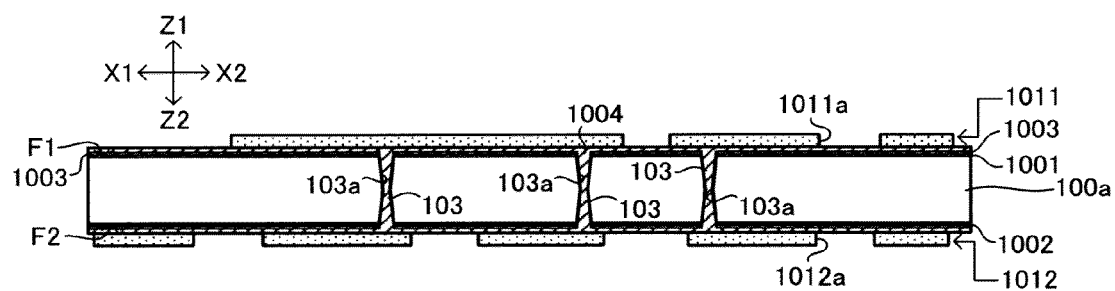
FIG. 15 is a view to illustrate a fourth step subsequent to the step in FIG. 14.
Figure 16:
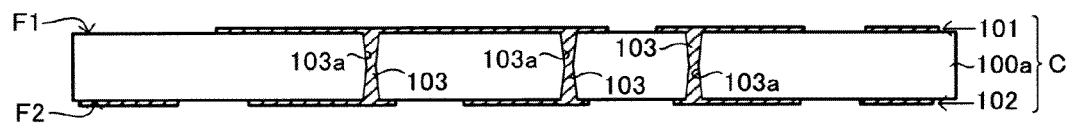
FIG. 16 is a view to illustrate a fifth step subsequent to the step in FIG. 15.

Next, using etching resists (1011, 1012), for example, as shown in FIG. 15, conductive layers formed respectively on first surface (F1) and second surface (F2) of substrate (100a) are patterned. Specifically, conductive layers are covered by their respective etching resists (1011, 1012) having patterns corresponding respectively to conductive layers (101, 102) (see FIG. 16). Then, portions of each conductive layer not covered by etching resists (1011, 1012) (portions exposed through opening portions (1011a, 1012a) of etching resists (1011, 1012)) are removed by wet or dry etching. Accordingly, conductive layers (101, 102) are formed respectively on first surface (F1) and second surface (F2) of substrate (100a) as shown in FIG. 16. As a result, core section (C) formed with substrate (100a) and conductive layers (101, 102) is completed. In the present embodiment, conductive layers (101, 102) are each made of copper foil, electroless copper plating and electrolytic copper plating.

Figure 17:
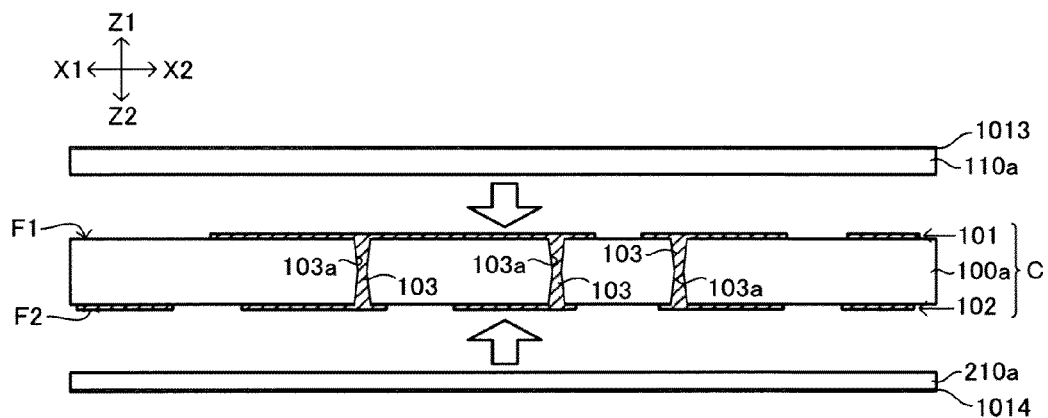
FIG. 17 is a view to illustrate a first step for forming first tiers in buildup sections of a wiring board in a method for manufacturing a wiring board according to the embodiment of the present invention.

Next, through lamination, for example, insulation layer (110a) having copper foil 1013 on one surface (resin-coated copper foil) is pressed onto first surface (F1) of substrate (100a), and insulation layer (210a) having copper foil 1014 on one surface (resin-coated copper foil) is pressed onto second surface (F2) of substrate (100a) as shown in FIG. 17.

In the present embodiment, insulation layer (110a) is thicker than insulation layer (210a). The thickness of insulation layer (110a) (after being cured) is in the range of 20 to 30 μm, and the thickness of insulation layer (210a) (after being cured) is in the range of 10 to 20 μm.

Figure 18:
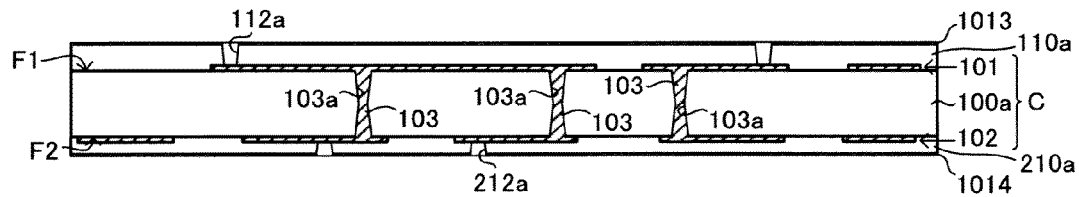
FIG. 18 is a view to illustrate a second step subsequent to the step in FIG. 17.

Next, using a laser, for example, via hole (112a) is formed in insulation layer (110a) and copper foil 1013, and via hole (212a) is formed in insulation layer (210a) and copper foil 1014 as shown in FIG. 18. Via hole (112a) reaches conductive layer 101, and via hole (212a) reaches conductive layer 102. Then, desmearing is conducted if required.

Figure 19:
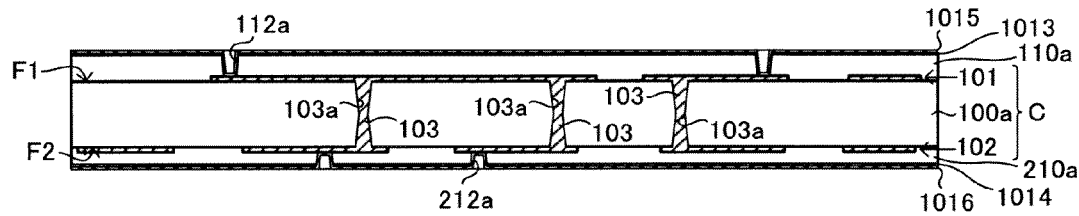
FIG. 19 is a view to illustrate a third step subsequent to the step in FIG. 18.

Next, by a chemical plating method, for example, electroless copper-plated films (1015, 1016) are formed on copper foils (1013, 1014) and in via holes (112a, 212a) as shown in FIG. 19. Prior to electroless plating, a catalyst made of palladium or the like may be adsorbed on surfaces of insulation layers (110a, 210a) and the like through immersion, for example.

Figure 20:
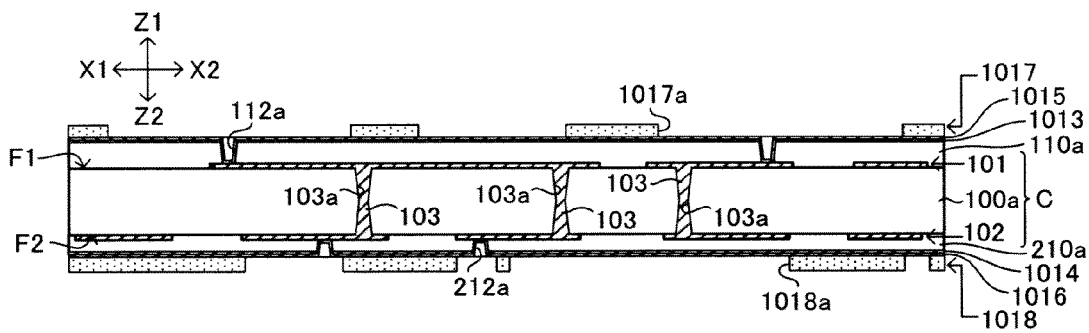
FIG. 20 is a view to illustrate a fourth step subsequent to the step in FIG. 19.

Next, using a lithographic technique, printing or the like, plating resist 1017 with opening portion (1017a) is formed on electroless plated film 1015, and plating resist 1018 with opening portion (1018a) is formed on electroless plated film 1016 as shown in FIG. 20. Opening portions (1017a, 1018a) correspond to their respective patterns of conductive layers (111, 211) (see FIG. 22).

Figure 21:
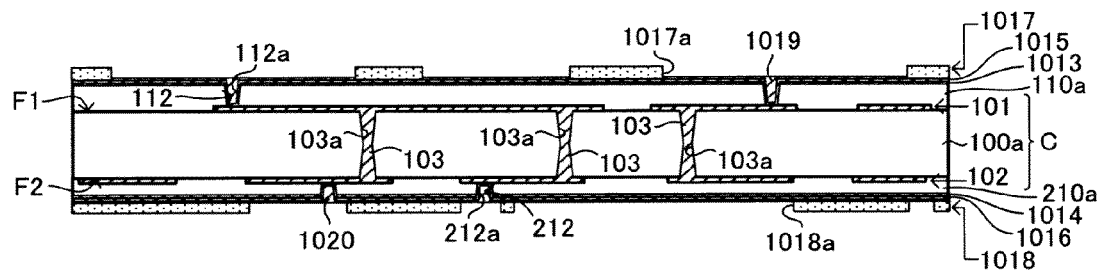
FIG. 21 is a view to illustrate a fifth step subsequent to the step in FIG. 20.

Next, using a pattern plating method, for example, electrolytic copper platings (1019, 1020), for example, are formed respectively in opening portions (1017a, 1018a) of plating resists (1017, 1018) as shown in FIG. 21. Specifically, copper as the plating material is connected to the anode, and electroless plated films (1015, 1016) as the material to be plated are connected to the cathode, and are then immersed in a plating solution. Then, DC voltage is applied between the poles to flow electric current, depositing copper on the surfaces of electroless plated films (1015, 1016). Accordingly, via holes (112a, 212a) are filled respectively with electrolytic platings (1019, 1020). Via conductors (112, 212) made of copper plating, for example, are formed.

Figure 22:
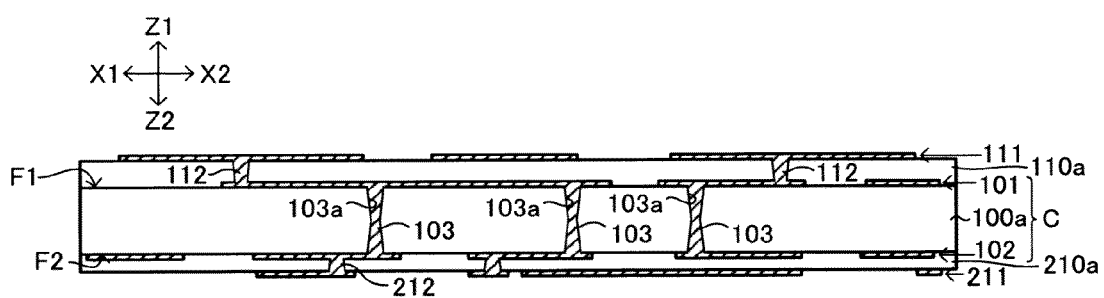
FIG. 22 is a view to illustrate a sixth step subsequent to the step in FIG. 21.

Then, using a predetermined removing solution, for example, plating resists (1017, 1018) are removed. After that, by removing unnecessary portions of electroless plated films (1015, 1016) and copper foils (1013, 1014), conductive layers (111, 211) are formed as shown in FIG. 22. As a result, first tiers are completed in first buildup section (B1) and second buildup section (B2).

The material for electroless plated films (1015, 1016) is not limited to copper, and nickel, titanium or chrome may be used, for example. Also, a seed layer for electrolytic plating is not limited to electroless plated film, and sputtered film, CVD film or the like may also be used as a seed layer instead of electroless plated films (1015, 1016).

Figure 23:
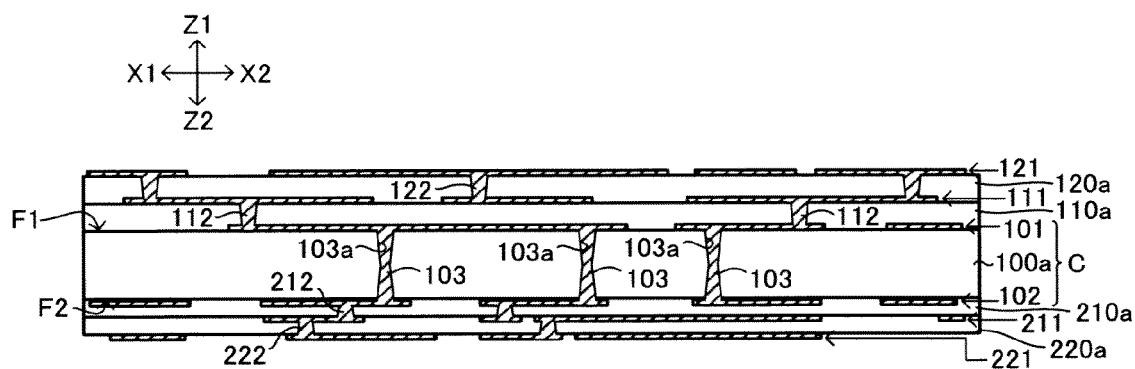
FIG. 23 is a view to illustrate a step for forming second tiers in a buildup section of a wiring board in a method for manufacturing a wiring board according to the embodiment of the present invention.

Next, the same as the first tiers, second tiers are formed in first buildup section (B1) and second buildup section (B2) as shown in FIG. 23. Insulation layer (120a) is also thicker than insulation layer (220a) in the second tiers, the same as in the first tiers. The thickness of insulation layer (120a) (after being cured) is in the range of 20 to 30 μm, and the thickness of insulation layer (220a) (after being cured) is in the range of 10 to 20 μm.

Figure 24:
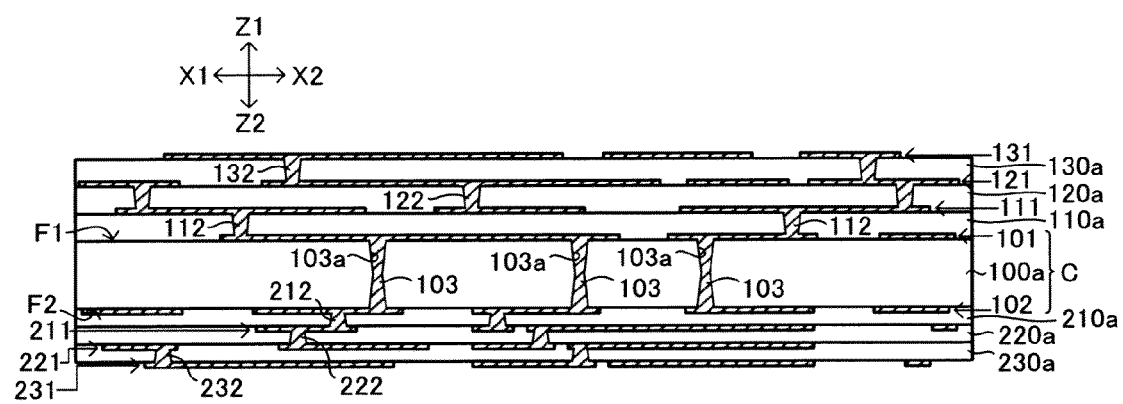
FIG. 24 is a view to illustrate a step for forming third tiers in the buildup sections of a wiring board in a method for manufacturing a wiring board according to the embodiment of the present invention.

Next, the same as in the first tiers, third tiers are formed in first buildup section (B1) and second buildup section (B2) as shown in FIG. 24. Insulation layer (130a) is also thicker than insulation layer (230a) in the third tiers, the same as in the first tiers. The thickness of insulation layer (130a) (after being cured) is in the range of 20 to 30 μm, and the thickness of insulation layer (230a) (after being cured) is in the range of 10 to 20 μm.

Figure 25:
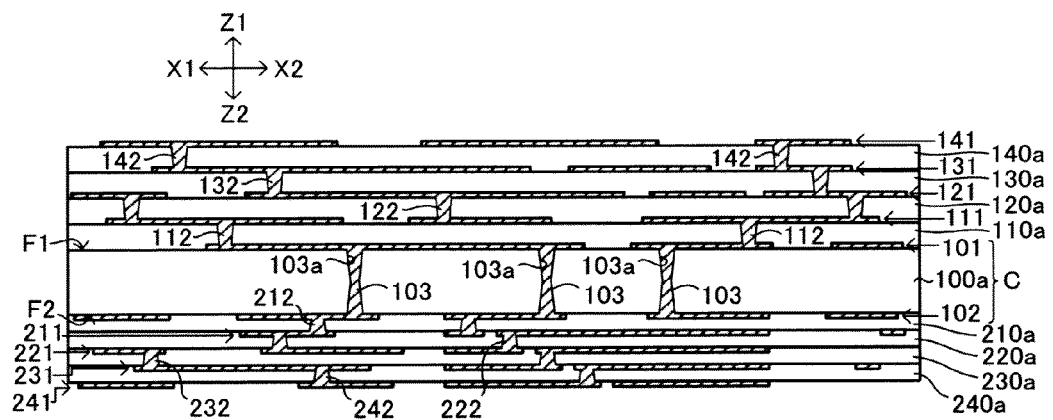
FIG. 25 is a view to illustrate a step for forming fourth tiers in the buildup sections of a wiring board in a method for manufacturing a wiring board according to the embodiment of the present invention.

Next, the same as in the first tiers, fourth tiers are formed in first buildup section (B1) and second buildup section (B2) as shown in FIG. 25. Insulation layer (140a) is also thicker than insulation layer (240a) in the fourth tiers, the same as in the first tiers. The thickness of insulation layer (140a) (after being cured) is in the range of 20 to 30 μm, and the thickness of insulation layer (240a) (after being cured) is in the range of 10 to 20 μm.

Figure 26:
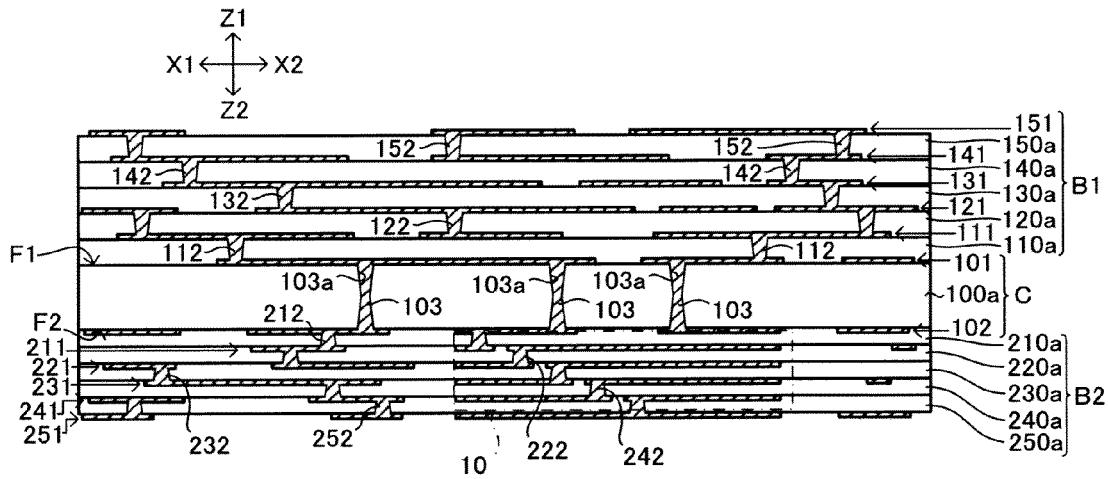
FIG. 26 is a view to illustrate a step for forming fifth tiers in the buildup sections of a wiring board in a method for manufacturing a wiring board according to the embodiment of the present invention.

Next, the same as in the first tiers, fifth tiers are formed in first buildup section (B1) and second buildup section (B2) as shown in FIG. 26. Insulation layer (150a) is also thicker than insulation layer (250a) in the fifth tiers, the same as in the first tiers. The thickness of insulation layer (150a) (after being cured) is in the range of 20 to 30 μm, and the thickness of insulation layer (250a) (after being cured) is in the range of 10 to 20 μm.

In the present embodiment, when first through fifth tiers are formed in second buildup section (B2), the conductors in second buildup section (B2) form inductor unit 10 (first inductor (10a) and second inductor (10b)) (see FIGS. 4-7B).

Next, solder resist 160 having opening portion (160a) is formed on insulation layer (150a), and solder resist 260 having opening portion (260a) is formed on insulation layer (250a) (see FIG. 1). Conductive layers (151, 251) are respectively covered by solder resists (160, 260) except for locations (such as pads) corresponding to opening portions (160a, 260a). Solder resists (160, 260) are formed by screen printing, spray coating, roll coating, lamination or the like, for example.

Next, by sputtering or the like, anticorrosion layers (160b, 260b) made of Ni/Au film, for example, are formed on conductive layers (151, 251), more specifically, on surfaces of pads not covered by solder resists (160, 260) (see FIG. 1). Also, by conducting an OSP treatment, anticorrosion layers (160b, 260b) may be formed with organic protective film.

Through the above procedures, wiring board 1000 of the present embodiment (FIG. 1) is completed. Then, electrical testing is performed if required.

The manufacturing method according to the present embodiment is suitable for manufacturing wiring board 1000. An excellent wiring board 1000 is obtained at low cost using such a manufacturing method.

An embodiment of the present invention has been described as above. However, the present invention is not limited to the above embodiment.

To differentiate the thicknesses of insulation layers between first buildup section (B1) and second buildup section (B2), any other method may be taken.

Figure 27A:
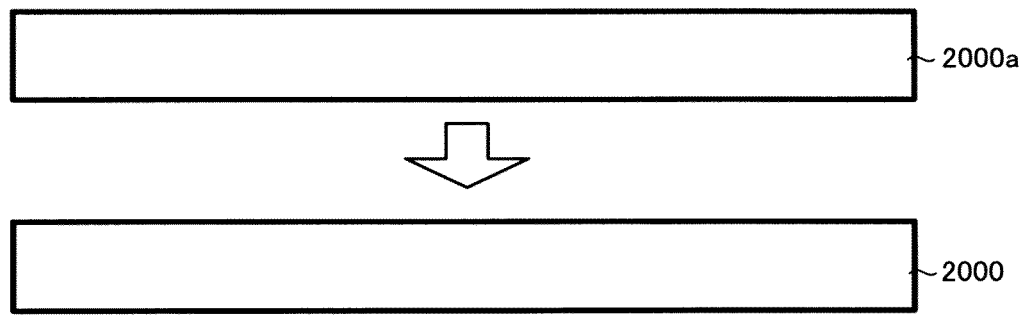
FIG. 27A is a view to illustrate a first method for increasing the thickness of a conductive layer of a wiring board according to the embodiment of the present invention.
Figure 27B:
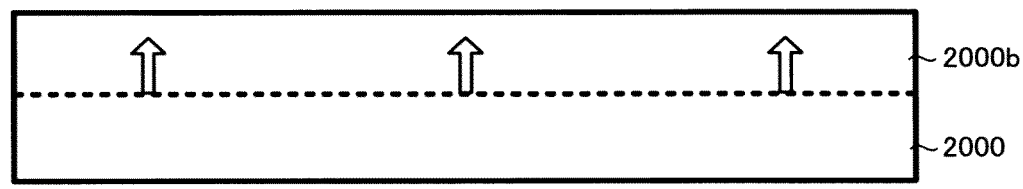
FIG. 27B is a view to illustrate a second method for increasing the thickness of a conductive layer of a wiring board according to the embodiment of the present invention.

For example, as shown in FIG. 27A, when increasing the thickness of insulation layer 2000, another insulative film (2000a) may be laminated on insulation layer 2000. For example, insulative body (2000b) may be grown on insulation layer 2000 by CVD or the like as shown in FIG. 27B.

Figure 28:
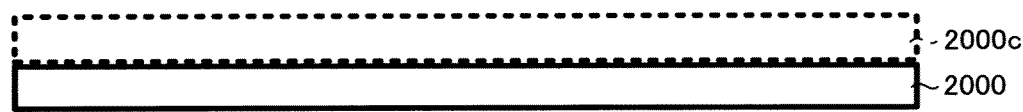
FIG. 28 is a view to illustrate a method for decreasing the thickness of a conductive layer of a wiring board according to the embodiment of the present invention.

When decreasing the thickness of insulation layer 2000, as shown in FIG. 28, for example, portion (2000c) of insulation layer 2000 may be chemically removed by etching, laser processing or the like. Alternatively, portion (2000c) of insulation layer 2000 may be mechanically shaved by polishing or the like.

Figure 29A:
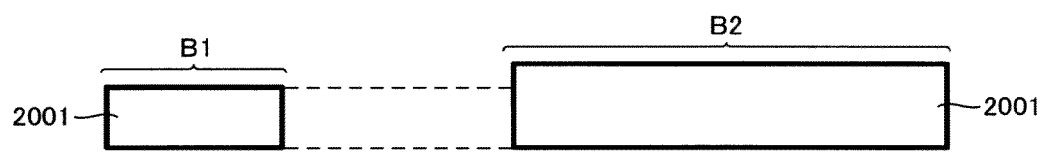
FIG. 29A is a view of a first structure showing a conductive layer in the first buildup section and a conductive layer in the second buildup section in the embodiment of the present invention.
Figure 29B:
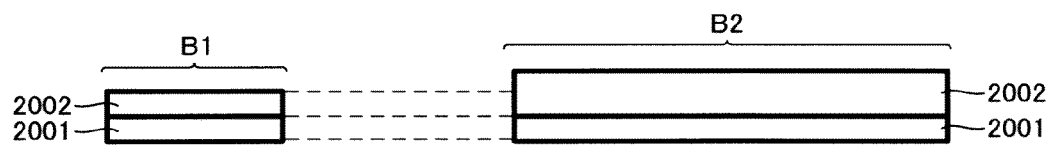
FIG. 29B is a view of a second structure showing a conductive layer in the first buildup section and a conductive layer in the second buildup section in the embodiment of the present invention.
Figure 29C:
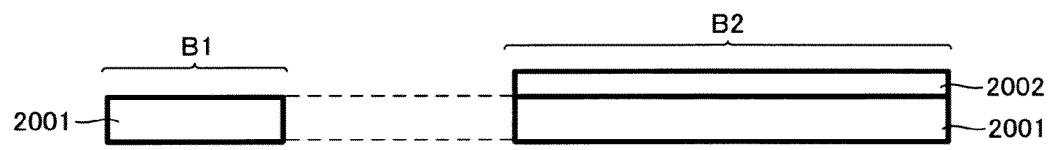
FIG. 29C is a view of a third structure showing a conductive layer in the first buildup section and a conductive layer in the second buildup section in the embodiment of the present invention.

If first buildup section (B1) and second buildup section (B2) each have one insulation layer (such as insulation layer 2001), a difference in their thicknesses is obtained by setting different thicknesses as shown in FIG. 29A, for example. Alternatively, if first buildup section (B1) and second buildup section (B2) each have multiple insulation layers (such as insulation layers (2001, 2002)), a difference in their thicknesses is obtained by setting a different thickness at least in one layer. For example, as shown in FIG. 29B, the thickness of insulation layer 2001 is set the same while only the thickness of insulation layer 2002 is set differently so that the buildup sections have different thicknesses. Yet alternatively, by setting the number of insulation layers differently in first buildup section (B1) and second buildup section (B2), their thicknesses will be different. For example, as shown in FIG. 29C, while first buildup section (B1) is structured with one insulation layer, second buildup section (B2) is structured with two insulation layers to differentiate their thicknesses.

In the above embodiment, each conductive layer in first buildup section (B1) and each conductive layer in second buildup section (B2) all have the same thickness. However, the present invention is not limited to such. For example, it is an option that each conductive layer in first buildup section (B1) may be thicker than any of the conductive layers in second buildup section (B2). Conversely, it is also an option that each conductive layer in second buildup section (B2) may be thicker than any of the conductive layers in first buildup section (B1).

In the above embodiment, each insulation layer in second buildup section (B2) is thicker than any of the insulation layers in first buildup section (B1). However, the present invention is not limited to such.

In the above embodiment, if the thickness of any one of the second insulation layers (insulation layers 210a~250a) formed on the second-surface (F2) side of substrate (100a) (core substrate) is thinner than the thickness of first insulation layers (insulation layers 110a~150a) formed on the first-surface (F1) side of substrate (100a) (core substrate), ratio W2/W1 is brought closer to 1, and wiring board 1000 seldom warps. As a result, electronic component 200 or the like is easily mounted on wiring board 1000 (see FIG. 1).

To suppress warping of wiring board 1000, it is more preferable for insulation layers (220a~240a) between their respective conductive patterns of inductor unit 10 (inductor section) in second buildup section (B2) each to be thinner than any of insulation layers (110a~150a) (see FIG. 1).

Also, if via conductors (212~252) of inductor unit 10 (inductor section) in second buildup section (B2) are each thinner than any of via conductors (112~152) in first buildup section (B1), the quality (Q value) of inductor unit 10 (inductor section) tends to be enhanced (see FIG. 1).

To suppress warping of wiring board 1000, when tiers at the same ordinal number (in the above embodiment, first tiers, second tiers, third tiers, fourth tiers or fifth tiers) are compared to each other, it is more preferable that the insulation layer in second buildup section (B2) be thinner than the insulation layer in first buildup section (B1) at least in one tier (see FIG. 1).

Figure 30:
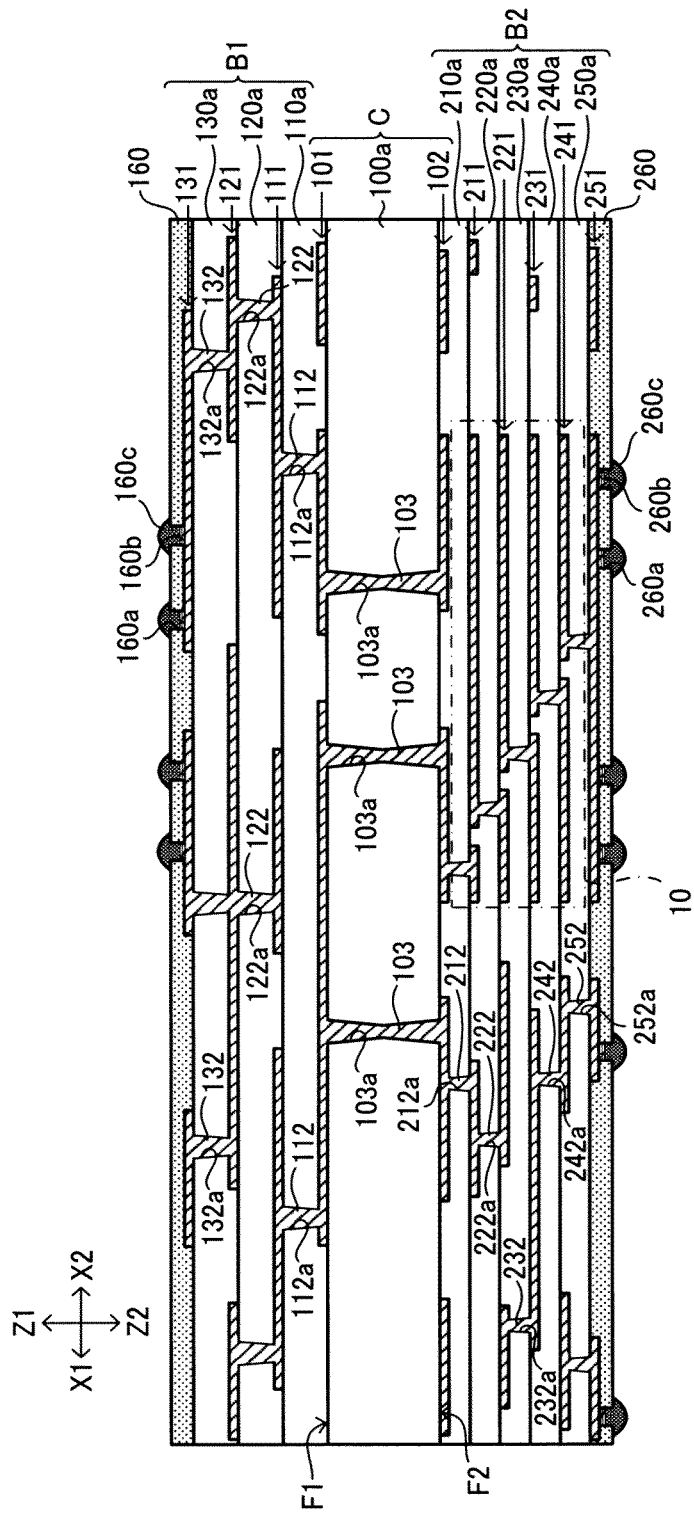
FIG. 30 is a cross-sectional view of an example showing a wiring board in another embodiment of the present invention in which the number of tiers is different on both surfaces (each main surface) of a core substrate.

In the above embodiment, the number of tiers is the same in first buildup section (B1) and in second buildup section (B2). However, the number of tiers may be different in both sections. For example, as shown in FIG. 30, the number of tiers in second buildup section (B2) (5, for example) may be greater than the number of tiers in first buildup section (B1) (3, for example). In such a case, when at least one of the insulation layers (210a~250a) in second buildup section (B2) is set thinner than any one of the insulation layers (110a~130a) in first buildup section (B1), ratio W2/W1 is brought closer to 1, and wiring board 1000 seldom warps. As a result, it is easier to mount electronic component 200 (see FIG. 1) or the like on wiring board 1000.

The above embodiment has described inductor unit 10, which is formed with first inductor (10a) and second inductor (10b) connected parallel to each other (see FIG. 6). However, the present invention is not limited to such. Inductor unit 10 may be structured with one inductor. Also, the number of turns of first inductor (10a) and second inductor (10b) is not limited to two, and may be any other number. For example, the number of turns may be three or more.

Regarding other factors, the structure of the above wiring board 1000, as well as type, performance, measurements, quality, shapes, number of layers, positioning and so forth of the elements of such a structure, may be modified freely within a scope that does not deviate from the gist of the present invention.

For example, the wiring board may further be multilayered by continuing the buildup process from the state shown previously in FIG. 26.

The material for each conductive layer is not limited to the above, and may be modified according to usage requirements or the like. For example, a non-metallic conductor or metal other than copper may be used as the material for conductive layers. The material for via conductors and through-hole conductors is not limited specifically. Also, the material for each insulation layer is not limited specifically. However, as for resins to form interlayer insulation layers, thermosetting resins or thermoplastic resins are preferred. As for thermosetting resins, for example, other than epoxy resin and polyimide, the following may be used: BT resin, allyl polyphenylene ether resin (A-PPE resin) or aramid resin. Also, as for thermoplastic resins, for example, liquid-crystal polymer (LCP), PEEK resin or PTFE resin (fluoro resin) may be used. Such materials are preferred to be selected according to requirements from the viewpoint of, for example, insulation, dielectric properties, heat resistance, mechanical features and so forth. In addition, the above resins may contain additives such as a curing agent, a stabilizer, filler or the like. Alternatively, each conductive layer and each insulation layer may be formed with multiple layers made of different materials.

Each conductor in opening portions (such as via conductors and through-hole conductors) is not limited to being a filled conductor, but may also be a conformal conductor.

The shape of each inductor is not limited to being a spiral form with a substantially rectangular shape when seen in a plan view, and any other form may be employed. For example, it may be a spiral form with a substantially circular shape when seen in a plan view.

The method for manufacturing wiring board 1000 is not limited to the order and contents shown in the above embodiment, and the order and contents may be modified within a scope that does not deviate from the gist of the present invention. Also, unnecessary processes may be omitted depending on usage requirements or the like.

For example, the method for forming each conductive layer is not limited specifically. For example, any one or a combination of two or more of the following methods may be used for forming conductive layers: panel plating, pattern plating, full additive, semi-additive (SAP), subtractive, transfer and tenting methods.

In addition, the method for forming each insulation layer (interlayer insulation layer) is not limited specifically. For example, instead of prepreg, a liquid-type or a film-type thermosetting resin or its composites, RCF (resin-coated copper foil) or the like may also be used.

Also, instead of using a laser, wet or dry etching may be used, for example. When etching is employed, the portions not required to be removed are preferred to be protected in advance using a resist or the like.

The above embodiment and modified examples or the like may be combined freely. It is preferred to select an appropriate combination according to usage requirements or the like. Each structure shown in FIGS. 29A-29C may be applied to wiring board 1000 shown in FIG. 1, or to the wiring board shown in FIG. 30.

A wiring board according to an embodiment of the present invention includes the following: a core substrate having a first surface and an opposite second surface; a first conductive pattern formed on the first surface of the core substrate; a first insulation layer formed on the first surface of the core substrate and on the first conductive pattern; a second conductive pattern formed on the second surface of the core substrate; a second insulation layer formed on the second surface of the core substrate and on the second conductive pattern; and an inductor section arranged on the second surface of the core substrate and formed with at least part of the second conductive patterns. In such a wiring board, any of the second insulation layers is thinner than the first insulation layer.

A method for manufacturing a wiring board according to another embodiment of the present invention includes the following: preparing a core substrate having a first surface and an opposite second surface; forming a first conductive pattern on the first surface of the core substrate; forming a first insulation layer on the first surface of the core substrate and on the first conductive pattern; forming a second conductive pattern on the second surface of the core substrate; forming a second insulation layer on the second surface of the core substrate and on the second conductive pattern; and on the second surface of the core substrate forming an inductor section formed with at least part of the second conductive pattern. In such a manufacturing method, the thickness of any of the second insulation layers is set thinner than the first insulation layer.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
a core structure having a first surface and a second surface on an opposite side of the first surface;
a first buildup structure formed on the first surface of the core structure and comprising a plurality of insulation layers; and
a second buildup structure formed on the second surface of the core structure and comprising a plurality of insulation layers and an inductor device,
wherein the insulation layers in the second buildup structure have thicknesses which are thinner than thicknesses of the insulation layers in the first buildup structure, and the inductor device in the second buildup structure is positioned on the second surface of the core structure and includes at least a portion of a first conductive pattern of the core structure, a plurality of conductive patterns formed on the insulation layers in the second buildup structure and a plurality of via conductors formed in the insulation layers in the second buildup structure such that the conductive patterns of the inductor device on different layers are connected by the via conductors.

2. The wiring board according to claim 1, wherein the core structure includes a core substrate, a first conductive pattern formed on a first surface of the core substrate, and a second conductive pattern formed on a second surface of the core substrate, the inductor device is positioned on the second surface of the core substrate, and the portion of the conductive pattern included in the inductor device is a portion of the second conductive pattern formed on the second surface of the core substrate.

3. The wiring board according to claim 1, wherein the inductor device is formed in a portion of the second buildup structure such that the portion of the second buildup structure corresponds to a surface portion of the wiring board on which a semiconductor device is mounted.

4. The wiring board according to claim 1, wherein the inductor device has a substantially annular form.

5. The wiring board according to claim 1, wherein the inductor device has a spiral form.

6. The wiring board according to claim 1, wherein each of the plurality of conductive patterns forming the inductor device has a substantially U-shaped form or a substantially L-shaped form.

7. The wiring board according to claim 1, wherein each of the insulation layers in the first buildup structure comprises a resin, and each of the insulation layers in the second buildup structure comprises a resin.

8. The wiring board according to claim 1, wherein the insulation layers in the first buildup structure and the insulation layers in the second buildup structure satisfy T2/T1 in a range of approximately 1 to approximately 3 where T1 represents a thickness of each of the insulation layers in the first buildup structure, and T2 represents a thickness of each of the insulation layers in the second buildup structure.

9. The wiring board according to claim 3, wherein the first buildup structure and the second buildup structure satisfy W2/W1 in a range of approximately 0.9 to approximately 1.2 at least in the surface portion for mounting the semiconductor device where W1 represents a volume ratio of conductive patterns in the first buildup structure, and W2 represents a volume ratio of conductive patterns in the second buildup structure.

10. The wiring board according to claim 2, wherein the core structure has a through-hole conductor penetrating through the core substrate and comprising a plating material filled in a through hole formed through the core substrate, the first conductive pattern formed on the first surface of the core substrate is connected to the second conductive pattern formed on the second surface of the core substrate by the conductor in the through-hole conductor.

11. The wiring board according to claim 10, wherein the through-hole conductor has a maximum width which is set at approximately 150 μm or smaller.

12. The wiring board according to claim 1, wherein the inductor device is formed in a plurality, and the plurality of inductor devices are connected in parallel to each other.

13. The wiring board according to claim 1, wherein the first buildup structure has a surface portion configured to mount a semiconductor device such that the inductor device is formed in a portion of the second buildup structure to correspond to the surface portion of the first buildup structure.

14. The wiring board according to claim 8, wherein the inductor device has a substantially annular form.

15. The wiring board according to claim 8, wherein the inductor device has a spiral form.

16. The wiring board according to claim 8, wherein each of the plurality of conductive patterns forming the inductor device has a substantially U-shaped form or a substantially L-shaped form.

17. The wiring board according to claim 8, wherein each of the insulation layers in the first buildup structure comprises a resin, and each of the insulation layers in the second buildup structure comprises a resin.

18. The wiring board according to claim 13, wherein the first buildup structure and the second buildup structure satisfy W2/W1 in a range of approximately 0.9 to approximately 1.2 at least in the surface portion for mounting the semiconductor device where W1 represents a volume ratio of conductive patterns in the first buildup structure, and W2 represents a volume ratio of conductive patterns in the second buildup structure.

19. The wiring board according to claim 8, wherein the inductor device is formed in a plurality, and the plurality of inductor devices are connected in parallel to each other.

20. The wiring board according to claim 2, wherein the first buildup structure has a surface portion configured to mount a semiconductor device such that the inductor device is formed in a portion of the second buildup structure to correspond to the surface portion of the first buildup structure.

* * * * *